United States Patent
Hwang et al.

(10) Patent No.: US 12,126,357 B2
(45) Date of Patent: Oct. 22, 2024

(54) ERROR CORRECTION CODE CIRCUIT AND SEMICONDUCTOR APPARATUS INCLUDING THE ERROR CORRECTION CODE CIRCUIT

(71) Applicant: SK hynix Inc., Icheon-si (KR)

(72) Inventors: Seon Woo Hwang, Icheon-si (KR); Seong Jin Kim, Icheon-si (KR); Jung Hwan Ji, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 6 days.

(21) Appl. No.: 18/085,236

(22) Filed: Dec. 20, 2022

(65) Prior Publication Data

US 2024/0022261 A1    Jan. 18, 2024

(30) Foreign Application Priority Data

Jul. 13, 2022 (KR) .......................... 10-2022-0086417

(51) Int. Cl.
*H03M 13/11* (2006.01)
*H03M 13/00* (2006.01)

(52) U.S. Cl.
CPC .... *H03M 13/1111* (2013.01); *H03M 13/6356* (2013.01)

(58) Field of Classification Search
CPC .......... H03M 13/1111; H03M 13/6356; H03M 13/13; H03M 13/1102; H03M 13/1515; H03M 13/152; H03M 13/23; H03M 13/2957; G06F 11/10
USPC ................................................. 714/752, 758
See application file for complete search history.

(56) References Cited

U.S. PATENT DOCUMENTS

| | | | |
|---|---|---|---|
| 2006/0156214 A1 | 7/2006 | Kikutake et al. | |
| 2011/0099459 A1* | 4/2011 | Nakamura | G06F 11/1048 714/763 |
| 2017/0192845 A1* | 7/2017 | Kim | G06F 11/1068 |
| 2018/0268917 A1* | 9/2018 | Lee | G11C 29/24 |
| 2018/0307559 A1* | 10/2018 | Lee | G06F 11/106 |
| 2019/0146870 A1* | 5/2019 | Cha | H03M 13/2906 714/755 |
| 2020/0218611 A1* | 7/2020 | Cha | G06F 11/1068 |
| 2021/0004289 A1 | 1/2021 | Lee et al. | |
| 2021/0083687 A1* | 3/2021 | Lee | H03M 13/116 |
| 2021/0224156 A1* | 7/2021 | Cho | G06F 11/1076 |
| 2022/0374309 A1* | 11/2022 | Kim | G06F 11/1048 |

(Continued)

FOREIGN PATENT DOCUMENTS

KR    1020240032388 A    3/2024

*Primary Examiner* — Albert Decady
*Assistant Examiner* — Osman M Alshack
(74) *Attorney, Agent, or Firm* — WILLIAM PARK & ASSOCIATES LTD.

(57) ABSTRACT

In an embodiment, an error correction code circuit is provided. The error correction code circuit includes an error correction code engine and data processing circuit. The error correction code engine is configured to generate a second parity signal and syndrome information by performing an operation on operation source data and a first parity signal. The data processing circuit is configured to output write data as the operation source data and output an internally generated dummy parity signal as the first parity signal during a write operation, and to output read data as the operation source data and output a read parity signal as the first parity signal during a read operation.

16 Claims, 7 Drawing Sheets

(56) References Cited

U.S. PATENT DOCUMENTS

2023/0004308 A1\* 1/2023 Kim .................... G06F 3/0688
2023/0119555 A1\* 4/2023 Kim .................... G06F 11/073
714/764

\* cited by examiner

ERROR CORRECTION CODE CIRCUIT AND SEMICONDUCTOR APPARATUS INCLUDING THE ERROR CORRECTION CODE CIRCUIT

CROSS-REFERENCES TO RELATED APPLICATION

The present application claims priority under 35 U.S.C. § 119(a) to Korean application number 10-2022-0086417, filed on Jul. 13, 2022, in the Korean Intellectual Property Office, which is incorporated herein by reference in its entirety.

BACKGROUND

1. Technical Field

Various embodiments generally relate to a semiconductor circuit, and particularly, to an error correction code circuit and a semiconductor apparatus including the error correction code circuit.

2. Related Art

In a semiconductor apparatus, for example, a semiconductor memory apparatus, time required for specifications related to various operations is reduced due to an increase in an operating speed, resulting in an increase in a bit error rate. Therefore, the semiconductor apparatus has an error correction code (ECC) function for correcting a bit error.

SUMMARY

An error correction code circuit in accordance with an embodiment of the present disclosure may include: an error correction code engine configured to generate a second parity signal and syndrome information by performing an ECC operation on operation source data and a first parity signal; and a data processing circuit configured to output write data as the operation source data and output an internally generated dummy parity signal as the first parity signal during a write operation, and to output read data as the operation source data and output a read parity signal as the first parity signal during a read operation.

An error correction code circuit in accordance with an embodiment of the present disclosure may include: a parity operation logic configured to generate a second parity signal by performing an operation on operation source data and a first parity signal; a syndrome operation logic configured to generate syndrome information by performing an operation on the second parity signal; and a data processing circuit configured to output write data as the operation source data, to delay the operation source data by a first time required for an operation on the second parity signal, to output the delayed data as first delayed data, and to output an internally generated dummy parity signal as the first parity signal during a write operation, and to output read data as the operation source data, to delay the operation source data by a second time required for an operation on the second parity signal and the syndrome information, to output the delayed data as second delayed data, and to output a read parity signal as the first parity signal during a read operation.

A semiconductor apparatus in accordance with an embodiment of the present disclosure may include: an error correction code circuit configured to generate a second parity signal and syndrome information by performing an operation on operation source data and a first parity signal, to use an internally generated dummy parity signal as the first parity signal during a write operation, and to use a read parity signal as the first parity signal during a read operation; a write path configured to write first delayed data and the second parity signal to a memory area during the write operation; and a read path configured to correct an error in second delayed data according to the syndrome information and output the error-corrected data during the read operation.

DETAILED DESCRIPTION

Hereinafter, embodiments of the present disclosure will be described in more detail with reference to the accompanying drawings.

Various embodiments are directed to providing an error correction code circuit capable of improving an ECC operation timing margin and thus improving the reliability of an ECC operation, and a semiconductor apparatus including the same.

Figure 1:
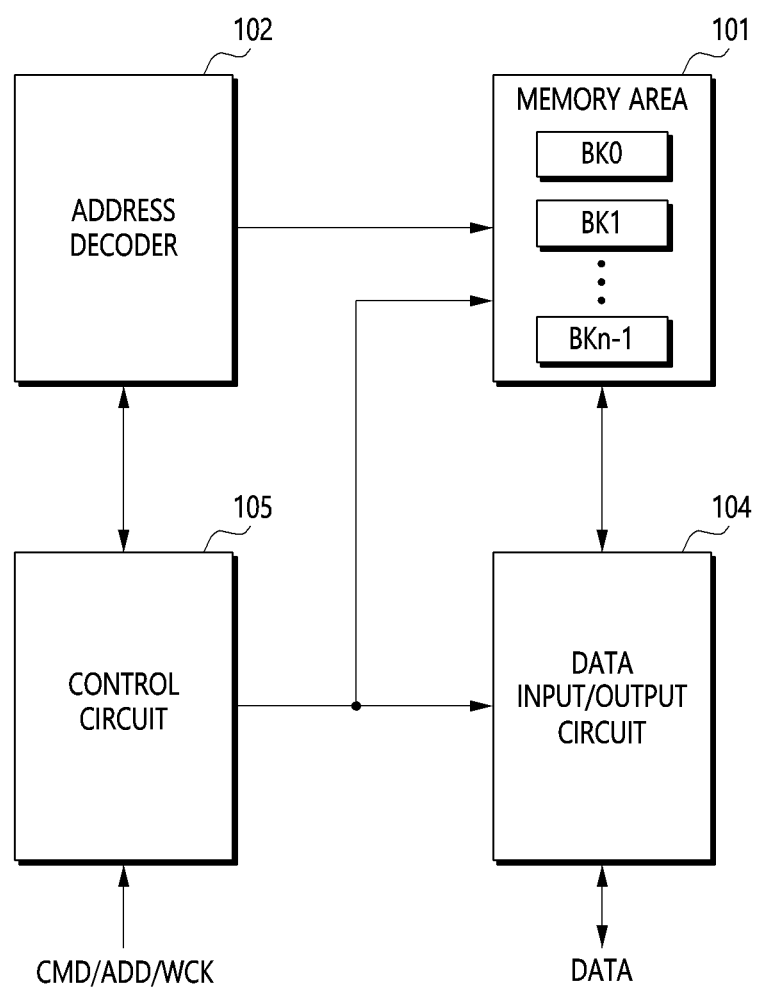
FIG. 1 is a diagram illustrating the configuration of a semiconductor apparatus in accordance with an embodiment of the present disclosure.

FIG. 1 is a diagram illustrating the configuration of a semiconductor apparatus 100 in accordance with an embodiment of the present disclosure.

The semiconductor apparatus 100 in accordance with an embodiment of the present disclosure may include a memory area 101, an address decoder 102, a data input/output circuit 104, and a control circuit 105.

The memory area 101 may include a plurality of memory cells, and the plurality of memory cells may each include at least one of a volatile memory and a nonvolatile memory. Examples of the volatile memory may include a static RAM (SRAM), a dynamic RAM (DRAM), and a synchronous DRAM (SDRAM), and examples of the nonvolatile memory may include a read only memory (ROM), a programmable ROM (PROM), an electrically erasable and programmable ROM (EEPROM), an electrically programmable ROM (EPROM), a flash memory, a phase-change RAM (PRAM), a magnetic RAM (MRAM), a resistive RAM (RRAM), and a ferroelectric RAM (FRAM). During a read operation of the semiconductor apparatus 100, data stored in the memory area 101 may be output, and during a write operation of the semiconductor apparatus 100, data input from an external system, for example, a memory controller or test equipment, may be stored in the memory area 101. The memory cells of the memory area 101 may be divided into a plurality of unit memory areas, for example, a plurality of memory banks BK0 to BKn−1.

The address decoder 102 may be connected to the control circuit 105 and the memory area 101. The address decoder 102 may decode an address signal provided by the control circuit 105, and access the memory area 101 in response to the decoding result.

The data input/output circuit 104 may be connected to the memory area 101. The data input/output circuit 104 may exchange data with the external system or the memory area 101. The data input/output circuit 104 may include a data input buffer, a data output buffer, a data input/output pad DQ, a pipe register, a test-related circuit, and the like.

The control circuit 105 may be connected to the memory area 101, the address decoder 102, and the data input/output circuit 104. The control circuit 105 may perform a control operation related to a test operation, the read operation, the write operation, and address processing of the semiconductor apparatus 100. The control circuit 105 may receive a command CMD, an address ADD, a clock signal WCK, and the like through a plurality of pads (not illustrated). The control circuit 105 may provide the data input/output circuit 104 with the address decoded through the address decoder 102.

Figure 2:
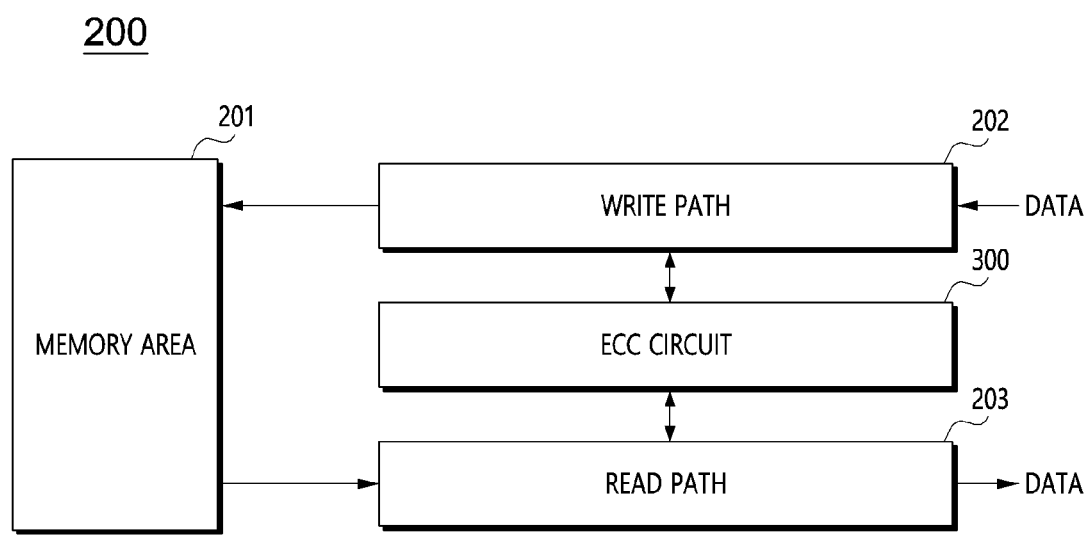
FIG. 2 is a diagram illustrating the configuration of a semiconductor apparatus including an error correction code circuit in accordance with an embodiment of the present disclosure.

FIG. 2 is a diagram illustrating the configuration of a semiconductor apparatus 200 including an error correction code circuit in accordance with an embodiment of the present disclosure.

Referring to FIG. 2, the semiconductor apparatus 200 in accordance with an embodiment of the present disclosure may include a memory area 201, a write path 202, a read path 203, and an ECC circuit 300.

The ECC circuit 300, that is, an error correction code circuit may be configured to generate a second parity signal and syndrome information by performing an operation on operation source data and a first parity signal, to use an internally generated dummy parity signal as the first parity signal during a write operation, and to use a read parity signal as the first parity signal during a read operation. The ECC circuit 300 may be configured to delay write data by a first time required for an operation on the second parity signal and output the delayed data as first delayed data during the write operation, and to delay read data by a second time required for an operation on the second parity signal and the syndrome information and output the delayed data as second delayed data during the read operation.

The write path 202 may be configured to write the first delayed data and the second parity signal to the memory area 201 during the write operation of the semiconductor apparatus 200.

The read path 203 may be configured to correct an error in the second delayed data according to the syndrome information and output the error-corrected data during the read operation of the semiconductor apparatus 200.

Figure 3:
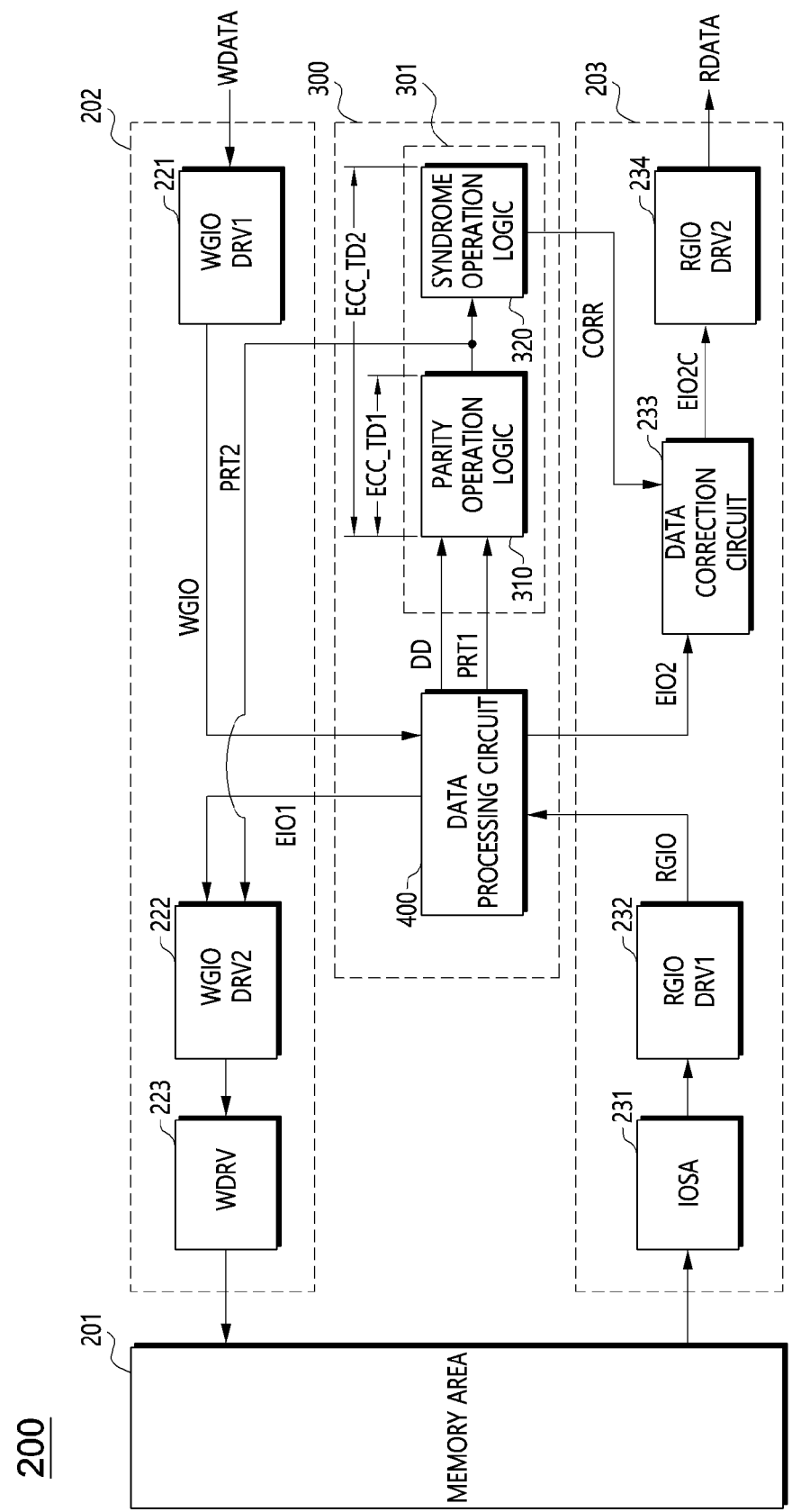
FIG. 3 is a diagram illustrating a detailed configuration of the semiconductor apparatus including the error correction code circuit in accordance with an embodiment of the present disclosure.

FIG. 3 is a diagram illustrating a detailed configuration of a semiconductor apparatus 200 including the error correction code circuit according to an embodiment of the present disclosure.

Referring to FIG. 3, the semiconductor apparatus 200 according to an embodiment of the present disclosure may include the memory area 201, the write path 202, the read path 203, and the ECC circuit 300.

The ECC circuit 300 may include an ECC engine 301 and a data processing circuit 400.

The ECC engine 301 may generate a second parity signal PRT2 and syndrome information CORR by performing an ECC operation on operation source data DD and a first parity signal PRT1. A method for the ECC operation may use coded modulation such as a low density parity check (LDPC) code, a Bose, Chaudhri, Hocquenghem (BCH) code, a turbo code, a Reed-Solomon code, a convolution code, a recursive systematic code (RSC), trellis-coded modulation (TCM), and block coded modulation (BCM). The ECC engine 301 may include a parity operation logic 310 and a syndrome operation logic 320.

The parity operation logic 310 may be configured to generate the second parity signal PRT2 according to the operation source data DD and the first parity signal PRT1. The parity operation logic 310 may be configured to transmit the second parity signal PRT2 to the syndrome operation logic 320.

The parity operation logic 310 may generate the second parity signal PRT2 by simultaneously performing an operation on the operation source data DD and the first parity signal PRT1. Accordingly, in an embodiment, during the read operation of the semiconductor apparatus 200, a timing difference between the timing at which a read parity signal and data are output from the memory area 201 and a final parity signal, that is, the second parity signal PRT2, may be compensated for without replica delay and/or separate timing control. Prior to being described below, in an embodiment, during the write operation of the semiconductor apparatus 200, since only data is provided from the outside without a parity signal, a dummy parity signal may be generated to have substantially the same timing as the read parity signal, and the parity operation logic 310 may generate the second parity signal PRT2 by simultaneously performing an operation on the dummy parity signal and the operation source data DD. Accordingly, in an embodiment, during the write operation of the semiconductor apparatus 200, a timing difference between the timing at which data is input from the outside and the final parity signal, that is, the second parity signal PRT2, may be compensated for without replica delay and/or separate timing control. The words "simultaneous" and "simultaneously" as used herein with respect to processes mean that the processes take place on overlapping intervals of time. For example, if a first process takes place over a first interval of time and a second process takes place simultaneously over a second interval of time, then the first and second intervals at least partially overlap each other such that there exists a time at which the first and second processes are both taking place.

The syndrome operation logic 320 may generate the syndrome information CORR according to the second parity signal PRT2. The second parity signal PRT2 may be divided into a signal generated during the read operation of the semiconductor apparatus 200 and a signal generated during the write operation of the semiconductor apparatus 200. The syndrome operation logic 320 may generate the syndrome information CORR according to the second parity signal PRT2 generated during the read operation of the semiconductor apparatus 200 and the second parity signal PRT2 generated during the write operation of the semiconductor apparatus 200.

The time required for the operation on the second parity signal PRT2 is referred to as a first time ECC_TD1, and the time required for the operation on the second parity signal PRT2 and the syndrome information CORR is referred to as a second time ECC_TD2. The second time ECC_TD2 may have a larger value than the first time ECC_TD1 because relatively more information is subjected to an operation for the second time ECC_TD2 compared to the first time ECC_TD1.

The data processing circuit 400 may be configured to output write data as the operation source data DD and output an internally generated dummy parity signal as the first parity signal PRT1 during the write operation, and to output read data as the operation source data DD and output a read parity signal as the first parity signal PRT1 during the read operation. The data processing circuit 400 may be configured to delay the write data by the first time ECC_TD1 and output the delayed data as first delayed data EIO1 during the write operation, and to delay the read data by the second time ECC_TD2 and output the delayed data as second delayed data EIO2 during the read operation.

The write path 202 may include a first line driver (WGIO DRV1) 221, a first global line WGIO, a second line driver (WGIO DRV2) 222, and a write driver (WDRV) 223.

The WGIO DRV1 221 may be configured to drive the write data and transmit the driven write data to the ECC circuit 300 through the first global line WGIO.

The first global line WGIO may be connected between the WGIO DRV1 221 and the ECC circuit 300.

The WGIO DRV2 222 may be configured to drive and output the first delayed data EIO1 and the second parity signal PRT2.

The WDRV 223 may be configured to drive the output of the WGIO DRV2 222 and write the driven output to the memory area 201.

The read path 203 may include a sense/amplification circuit (IOSA) 231, a first line driver (RGIO DRV1) 232, a second global line RGIO, a data correction circuit 233, and a second line driver (RGIO DRV2) 234.

Although it is described that the data correction circuit 233 is included in the read path in the embodiment of the present disclosure, this is only one circuit design method, and the data correction circuit 233 may also be included as one of the components of the ECC circuit 300.

The IOSA 231 may be configured to output read data generated by sensing and amplifying data corresponding to a read operation-related address and a corresponding read parity signal in the memory area 201.

The RGIO DRV1 232 may be configured to drive the output of the IOSA 231 and transmit the driven output to the second global line RGIO.

The second global line RGIO may be configured to transmit the output of the RGIO DRV1 232 to the ECC circuit 300.

The data correction circuit 233 may be configured to correct an error included in the second delayed data EIO2 according to the syndrome information CORR, and to output a resultant of the correction as error-corrected data EIO2C. The data correction circuit 233 may correct the error included in the second delayed data EIO2 by selectively inverting bits of the second delayed data EIO2 according to the syndrome information CORR. For example, when the second delayed data EIO2 includes n-bit normal data and an m-bit parity signal, the syndrome information CORR may have n+m bits. The data correction circuit 233 may perform error correction by inverting the logic level of a bit (or bits) of the second delayed data EIO2 corresponding to a bit (or bits) having a logic high value among the n+m bits of the syndrome information CORR. In an embodiment, n is a natural number greater than zero and m is a natural number greater than zero.

Hereinafter, the first delayed data EIO1 and the second delayed data EIO2 may be collectively referred to as delayed data EIO, and for convenience of description, delayed data EIO during the write operation of the semiconductor apparatus is referred to as the first delayed data EIO1 and delayed data EIO during the read operation of the semiconductor apparatus is referred to as the second delayed data EIO2.

The RGIO DRV2 234 may be configured to drive and output the output of the data correction circuit 233.

The lengths of the first global line WGIO and the second global line RGIO may be relatively longer than other interconnections inside the semiconductor apparatus 200. Therefore, since the embodiment of the present disclosure is merely an example in which the drivers 221, 222, 232, and 234 are connected to the paths of the first global line WGIO and the second global line RGIO to serve as repeaters for reinforcing the strength of a signal transmitted through the first global line WGIO and the second global line RGIO so that the strength is recognizable by a receiving side, the drivers 221, 222, 232, and 234 are not essential components. The drivers 221, 222, 232, and 234 may also be removed according to PVT (process, voltage, temperature) conditions including the lengths of the first global line WGIO and the second global line RGIO and the strength of a signal transmitted through the first global line WGIO and the second global line RGIO. When the drivers 221, 222, 232, and 234 are not included, the WDRV 223 may be configured to directly drive the first delayed data EIO1 and the second parity signal PRT2 and write the driven data to the memory area 201, and the IOSA 231 may be configured to directly transmit, to the second global line RGIO, the read data generated by sensing and amplifying the data, corresponding to the read operation-related address, and the read parity signal in the memory area 201.

Figure 4:
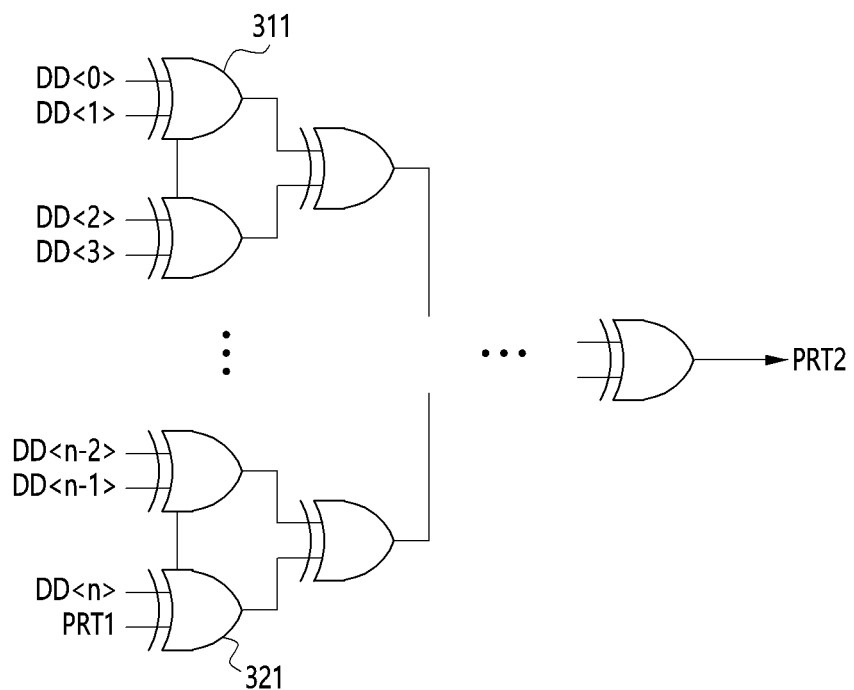
FIG. 4 is a diagram illustrating the configuration of a parity operation logic in FIG. 3.

FIG. 4 is a diagram illustrating the configuration of the parity operation logic 310 in FIG. 3.

Referring to FIG. 4, the parity operation logic 310 may include a plurality of logic gates 311 and 321. Each of the plurality of logic gates 311 and 321 may be configured as an exclusive OR gate. The plurality of logic gates 311 and 321 may output, as the second parity signal PRT2, the result of simultaneously performing an operation on n-bit operation source data DD<0:n> and the first parity signal PRT1.

In this case, when "n" is an odd number, the parity operation logic 310 may be configured to input the first parity signal PRT1 to an extra input terminal of the plurality of logic gates 311 and 321, that is, to one of input terminals of the logic gate 321. FIG. 4 illustrates an example of the configuration of the parity operation logic 310 when "n" is an odd number.

On the other hand, when "n" is an even number, there is no extra input terminal. Therefore, a dummy logic gate may be added to the parity operation logic 310, and the first parity signal PRT1 and any of the n-bit operation source data DD<0:n> may be input to input terminals of the dummy logic gate, thereby enabling simultaneous operation on the operation source data DD and the first parity signal PRT1.

Figure 5:
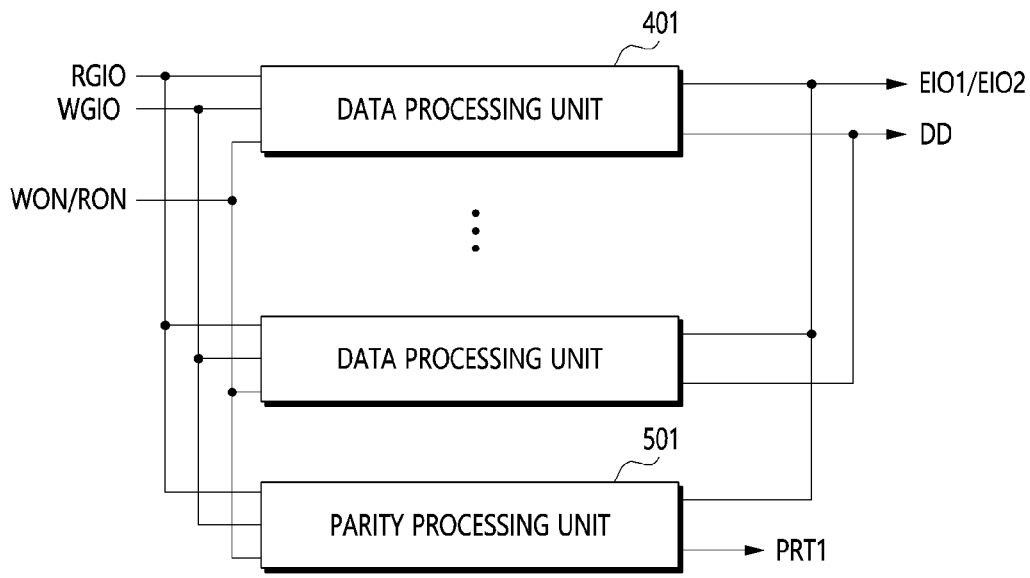
FIG. 5 is a diagram illustrating the configuration of a data processing circuit in FIG. 3.

FIG. 5 is a diagram illustrating the configuration of the data processing circuit 400 in FIG. 3.

Referring to FIG. 5, the data processing circuit 400 may include a plurality of data processing units 401 and a parity processing unit 501.

Each of the plurality of data processing units 401 may be configured to output the write data transmitted through the first global line WGIO and the read data transmitted through the second global line RGIO as the operation source data DD in response to a write enable signal WON and a read enable signal RON, to delay the operation source data DD by the first time in response to any one of the write enable signal WON and the read enable signal RON and output the delayed data as the first delayed data EIO1, and to delay the read data by the second time and output the delayed data as the second delayed data EIO2.

The read enable signal RON may be activated for a predetermined period during the read operation of the semiconductor apparatus 200. The write enable signal WON may be activated for a predetermined period during the write operation of the semiconductor apparatus 200. In this case, the activation may be defined as a case in which a corresponding signal has a high level. The word "predetermined" as used herein with respect to a parameter, such as a predetermined period, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The parity processing unit 501 may be configured to output the read parity signal transmitted through the second global line RGIO as the first parity signal PRT1 in response to the read enable signal RON, to generate a dummy parity signal in response to the write enable signal WON, and to output the generated dummy parity signal as the first parity signal PRT1.

Figure 6:
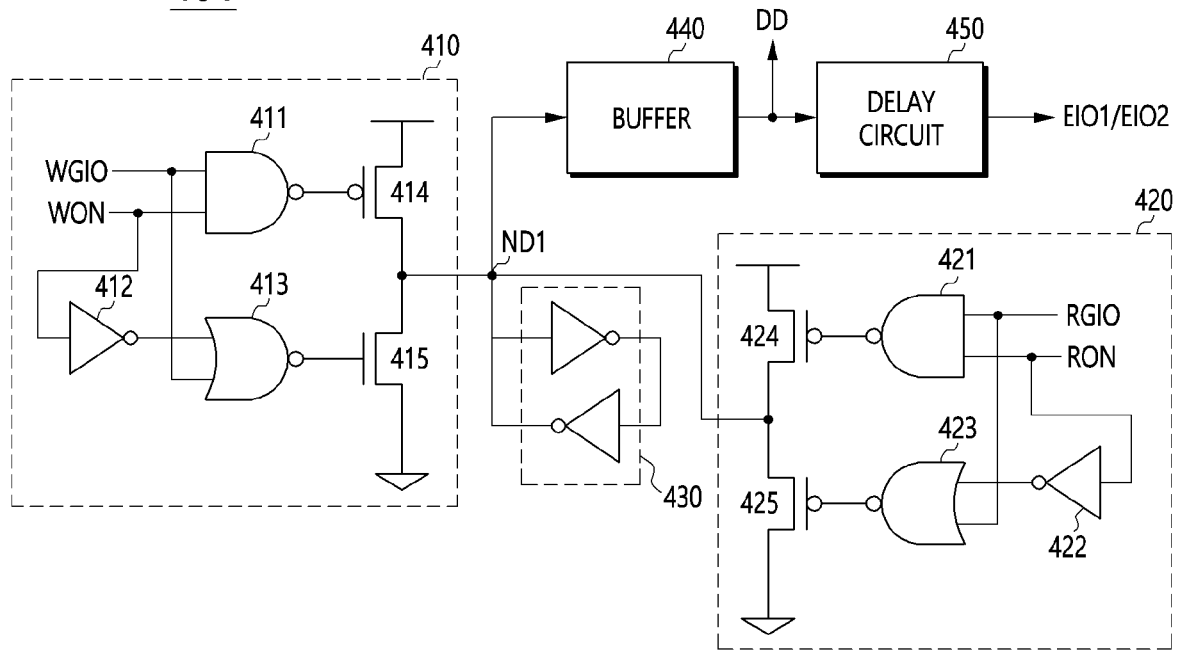
FIG. 6 is a diagram illustrating the configuration of any one of a plurality of data processing units in FIG. 5.

FIG. 6 is a diagram illustrating the configuration of any one of the plurality of data processing units 401 in FIG. 5.

Referring to FIG. 6, the data processing unit 401 may include a write data processing circuit 410, a read data processing circuit 420, and a delay circuit 450.

The data processing unit 401 may further include a latch 430 and a buffer 440.

The write data processing circuit 410 may output the write data as the operation source data DD in response to the write enable signal WON. The write data processing circuit 410 may include first to third logic gates 411 to 413 and drivers 414 and 415. The first logic gate 411 may perform a NAND operation on one bit of the write data and the write enable signal WON and output the operation result. The second logic gate 412 may invert and output the write enable signal WON. The third logic gate 413 may perform a NOR operation on one bit of the write data and the output of the second logic gate 412 and output the operation result. The drivers 414 and 415 may drive an output node ND1 to a power supply voltage level or a ground voltage level according to the output of the first logic gate 411 and the output of the third logic gate 413.

The latch 430 may be connected to the output node ND1 and may maintain the voltage level of the output node ND1.

The buffer 440 may buffer a signal applied to the output node ND1 and output the buffered signal as the operation source data DD.

The read data processing circuit 420 may output the read data as the operation source data DD in response to the read enable signal RON. The read data processing circuit 420 may include first to third logic gates 421 to 423 and drivers 424 and 425. The first logic gate 421 may perform a NAND operation on one bit of the read data and the read enable signal RON and output the operation result. The second logic gate 422 may invert and output the read enable signal RON. The third logic gate 423 may perform a NOR operation on one bit of the read data and the output of the second logic gate 422 and output the operation result. The drivers 424 and 425 may drive the output node ND1 to the power supply voltage level or the ground voltage level according to the output of the first logic gate 421 and the output of the third logic gate 423.

The delay circuit 450 may be configured to generate the first delayed data EIO1 by delaying the operation source data DD by the first time in response to the write enable signal WON, and to generate the second delayed data EIO2 by delaying the operation source data DD by the second time in response to the read enable signal RON.

Figure 7:
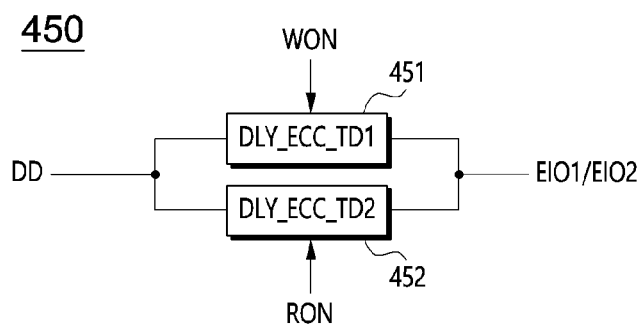
FIG. 7 is a diagram illustrating the configuration of a delay circuit in FIG. 6.

FIG. 7 is a diagram illustrating the configuration of the delay circuit 450 in FIG. 6.

Referring to FIG. 7, the delay circuit 450 may include a first delay (DLY_ECC_TD1) 451 and a second delay (DLY_ECC_TD2) 452.

The DLY_ECC_TD1 451 may delay the operation source data DD by the first time ECC_TD1 in response to the write enable signal WON, and output the delayed signal as the first delayed data EIO1. When the write enable signal WON is activated, the DLY_ECC_TD1 451 may delay the operation source data DD by the first time ECC_TD1 and output the delayed signal as the first delayed data EIO1.

The DLY_ECC_TD2 452 may delay the operation source data DD by the second time ECC_TD2 in response to the read enable signal RON, and output the delayed signal as the second delayed data EIO2. When the read enable signal RON is activated, the DLY_ECC_TD2 452 may delay the operation source data DD by the second time ECC_TD2 and output the delayed signal as the second delayed data EIO2.

Figure 8:
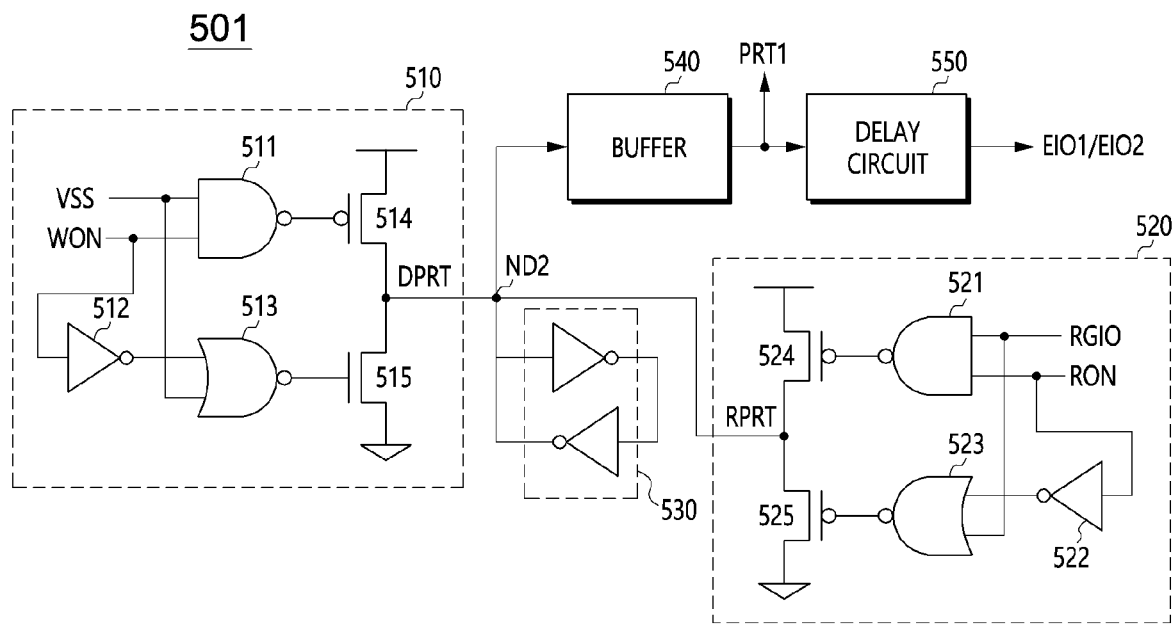
FIG. 8 is a diagram illustrating the configuration of a parity processing unit in FIG. 5.

FIG. 8 is a diagram illustrating the configuration of the parity processing unit 501 in FIG. 5.

Referring to FIG. 8, the parity processing unit 501 may include a dummy parity generation circuit 510, a parity generation circuit 520, and a delay circuit 550. The parity processing unit 501 may further include a latch 530 and a buffer 540.

The dummy parity generation circuit 510 may be configured to generate a dummy parity signal DPRT in response to the write enable signal WON and a ground voltage VSS, and to output the dummy parity signal DPRT as the first parity signal PRT1. The dummy parity generation circuit 510 may include first to third logic gates 511 to 513 and drivers 514 and 515. The first logic gate 511 may perform a NAND operation on the write enable signal WON and the ground voltage VSS, and output the operation result. The second logic gate 512 may invert and output the write enable signal WON. The third logic gate 513 may perform a NOR operation on the ground voltage VSS and the output of the second logic gate 512, and output the operation result. The drivers 514 and 515 may output the dummy parity signal DPRT having the ground voltage VSS level through the output node ND2 according to the output of the first logic gate 511 and the output of the third logic gate 513. The dummy parity generation circuit 510 may generate the dummy parity signal DPRT having a logic low value only when the write enable signal WON is activated, that is, only when the write enable signal WON has a high level.

As described above, in an embodiment, during the write operation of the semiconductor apparatus 200, only data is provided from the outside of the semiconductor apparatus 200 and no parity signal is provided. Accordingly, in the embodiment of the present disclosure, the dummy parity signal DPRT corresponding to the read parity signal is generated through the dummy parity generation circuit 510. Furthermore, in an ECC operation, "0" is an identity for all signal bits used in the operation. That is, in an embodiment, even though the dummy parity signal DPRT having a logic low value is used in the ECC operation, it does not affect an ECC operation result. Therefore, according to an embodiment of the present disclosure, the dummy parity generation circuit 510 is configured to generate the dummy parity signal DPRT having a logic low value only when the write enable signal WON has a high level.

The latch 530 may be connected to the output node ND2 and may maintain the voltage level of the output node ND2.

The buffer 540 may buffer a signal applied to the output node ND2 and output the buffered signal.

The parity generation circuit 520 may be configured to output the read parity signal RPRT as the first parity signal PRT1 in response to the read enable signal RON. The parity generation circuit 520 may include first to third logic gates 521 to 523 and drivers 524 and 525. The first logic gate 521 may perform a NAND operation on the read enable signal RON and a parity signal input through the second global line RGIO, and output the operation result. The second logic gate 522 may invert and output the read enable signal RON. The third logic gate 523 may perform a NOR operation on the parity signal input through the second global line RGIO and the output of the second logic gate 522, and output the operation result. The drivers 524 and 525 may output the read parity signal RPRT through the output node ND2 according to the output of the first logic gate 521 and the output of the third logic gate 523.

When the write enable signal WON is activated, the delay circuit 550 may delay the first parity signal PRT1 by the first time and output the delayed signal as the first delayed data EIO1, and when the read enable signal RON is activated, the delay circuit 550 may delay the first parity signal PRT1 by the second time and output the delayed signal as the second delayed data EIO2. The delay circuit 550 may have substantially the same configuration as that of FIG. 7.

Figure 9:
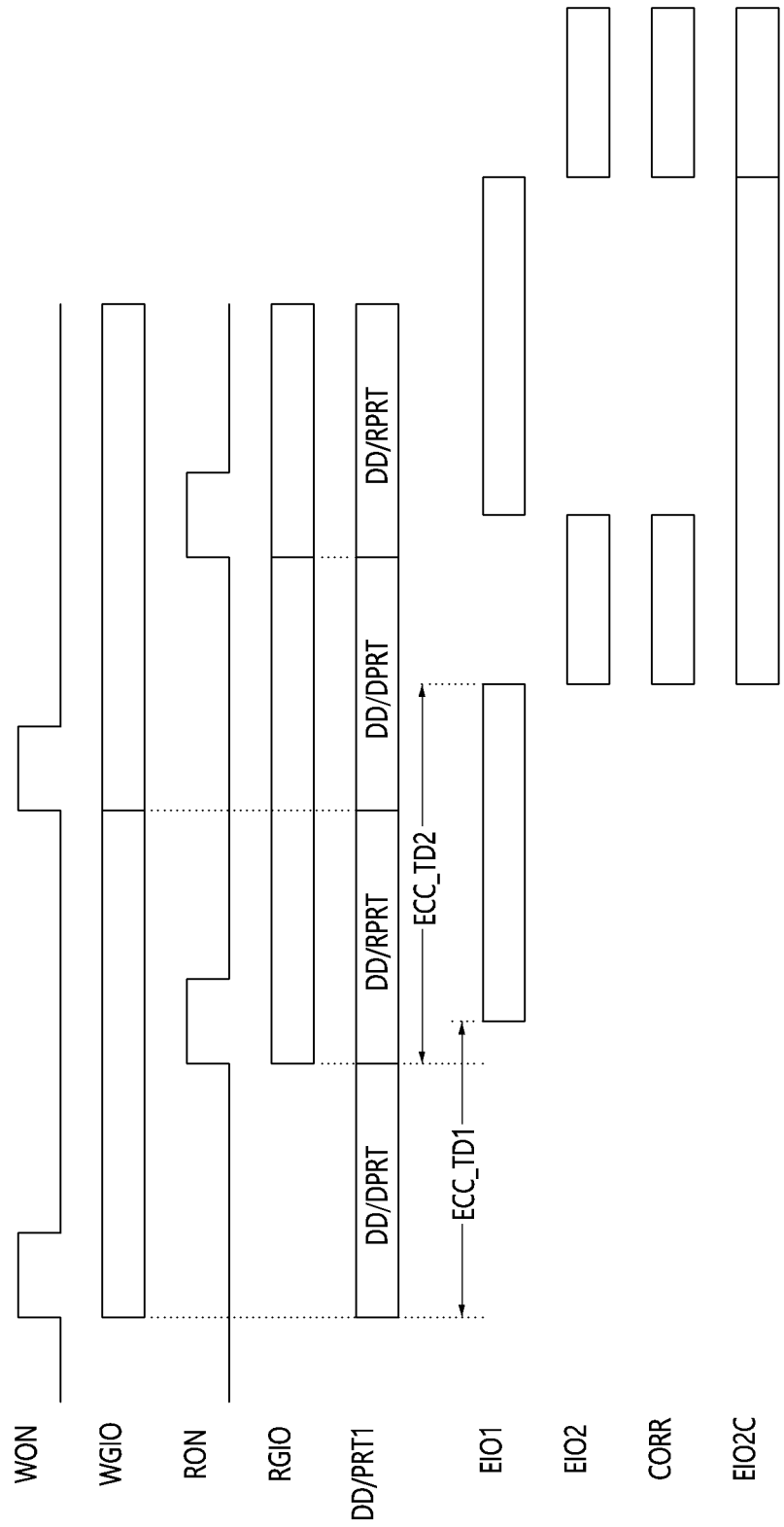
FIG. 9 is an operation timing diagram of the semiconductor apparatus including the error correction code circuit in accordance with an embodiment of the present disclosure.

FIG. 9 is an operation timing diagram of the semiconductor apparatus 200 including the error correction code circuit in accordance with an embodiment of the present disclosure.

First, a write operation of the semiconductor apparatus associated with an ECC operation will be described with reference to FIGS. 3 to 9.

Data may be transmitted from the outside of the semiconductor apparatus 200 through the first global line WGIO in response to an activation of the write enable signal WON.

The dummy parity signal DPRT may be generated internally in the semiconductor apparatus 200 in response to the activation of the write enable signal WON, and may be provided to the ECC circuit 300 as the first parity signal PRT1 simultaneously with the operation source data DD.

The ECC circuit 300 may generate the second parity signal PRT2 by performing an ECC operation on the first parity signal PRT1 and the operation source data DD.

During the write operation, since the second parity signal PRT2 is generated by simultaneously performing an operation on the operation source data DD and the first parity signal PRT1, that is, the dummy parity signal, the timing difference between the timing at which data is input from the outside and a final parity signal, that is, the second parity signal PRT2 may be compensated for without replica delay and/or separate timing control.

The operation source data DD and the first parity signal PRT1 or the operation source data DD may be delayed by the first time ECC_TD1 required for the operation on the second parity signal PRT2, so that the first delayed data EIO1 may be generated.

The first delayed data EIO1 and the second parity signal PRT2 may be written to the memory area 201 with the same timing.

Next, a read operation of the semiconductor apparatus associated with an ECC operation will be described with reference to FIGS. 3 to 9.

In response to an activation of the read enable signal RON, data and a parity signal may be transmitted from the memory area 201 through the second global line RGIO.

A parity signal, that is, the read parity signal RPRT, may be input from the outside of the semiconductor apparatus 200 in response to the activation of the read enable signal RON, and may be provided to the ECC circuit 300 as the first parity signal PRT1 simultaneously with the operation source data DD.

The ECC circuit 300 may generate the second parity signal PRT2 according to the first parity signal PRT1 and the operation source data DD, and generate the syndrome information CORR according to the second parity signal PRT2 and the operation source data DD.

During the read operation, since the second parity signal PRT2 is generated by simultaneously performing an operation on the operation source data DD and the first parity signal PRT1, that is, the read parity signal, the timing difference between the timing at which the read parity signal is output from the memory area and a final parity signal, that is, the second parity signal PRT2 may be compensated for without replica delay and/or separate timing control.

The operation source data DD and the first parity signal PRT1 or the operation source data DD may be delayed by the second time ECC_TD2 required for the operation on the second parity signal PRT2 and the syndrome information CORR, so that the second delayed data EIO2 may be generated.

The second delayed data EIO2 and the syndrome information CORR may be provided to the data correction circuit 233 with the same timing.

The data correction circuit 233 may correct an error included in the second delayed data EIO2 according to the syndrome information CORR, and output the error-corrected data EIO2C.

The error-corrected data EIO2C may be output to the outside of the semiconductor apparatus 200 via the RGIO DRV2 234.

A person skilled in the art to which the present disclosure pertains can understand that the present disclosure may be carried out in other specific forms without changing its technical spirit or essential features. Therefore, it should be understood that the embodiments described above are illustrative in all aspects, not limitative. The scope of the present disclosure is defined by the claims to be described below rather than the detailed description, and it should be construed that all changes or modified forms derived from the meaning and scope of the claims and the equivalent concept thereof are included in the scope of the present disclosure.

What is claimed is:

1. An error correction code circuit comprising:
an error correction code engine configured to generate a second parity signal by performing an error correction code (ECC) operation on operation source data and a first parity signal; and
a data processing circuit configured to output write data as the operation source data and output an internally generated dummy parity signal as the first parity signal during a write operation, and to output read data as the operation source data and output a read parity signal as the first parity signal during a read operation, wherein each of the data processing circuit comprises:
  a write data processing circuit configured to output the write data as the operation source data in response to a write enable signal;
  a read data processing circuit configured to output the read data as the operation source data in response to a read enable signal; and
  a delay circuit configured to generate a first delayed data by delaying the operation source data by a first time in response to the write enable signal, and to generate a second delayed data by delaying the operation source data by a second time in response to the read enable signal.

2. The error correction code circuit according to claim 1, wherein the error correction code engine comprises:
  a parity operation logic configured to generate the second parity signal by performing the operation on the operation source data and the first parity signal; and
  a syndrome operation logic configured to generate the syndrome information by performing an operation on the second parity signal.

3. The error correction code circuit according to claim 1, wherein the data processing circuit comprises:
  a plurality of data processing units configured to output the read data and the write data as the operation source data; and
  a parity processing unit configured to output the read parity signal as the first parity signal and output the dummy parity signal as the first parity signal.

4. The error correction code circuit according to claim 3, wherein the parity processing unit comprises:
  a dummy parity generation circuit configured to generate the dummy parity signal in response to the write enable signal and output the dummy parity signal as the first parity signal; and
  a parity generation circuit configured to output an externally provided read parity signal as the first parity signal in response to the read enable signal.

5. The error correction code circuit according to claim 1, wherein the data processing circuit is configured to delay the operation source data by the first time required for an operation on the second parity signal and to output the delayed data as the first delayed data during the write operation, and to delay the operation source data by the second time required for an operation on the second parity signal and the syndrome information and to output the delayed data as the second delayed data during the read operation.

6. The error correction code circuit according to claim 5, wherein the data processing circuit comprises:
  a plurality of data processing units configured to output each of the write data and the read data as the operation source data, to delay the operation source data by the first time and output the delayed data as the first delayed data during the write operation, and to delay the operation source data by the second time and output the delayed data as the second delayed data during the read operation; and
  a parity processing unit configured to output the read parity signal as the first parity signal during the read operation and output the dummy parity signal as the first parity signal during the write operation.

7. The error correction code circuit according to claim 6, wherein the parity processing unit comprises:
  a dummy parity generation circuit configured to generate the dummy parity signal in response to the write enable signal and output the dummy parity signal as the first parity signal; and
  a parity generation circuit configured to output the read parity signal as the first parity signal in response to the read enable signal.

8. An error correction code circuit comprising:
  a parity operation logic configured to generate a second parity signal by performing an operation on operation source data and a first parity signal;
  a syndrome operation logic configured to generate syndrome information by performing an operation on the second parity signal; and
  a data processing circuit configured to output write data as the operation source data, to delay the operation source data by a first time required for an operation on the second parity signal, to output the delayed data as first delayed data, and to output an internally generated dummy parity signal as the first parity signal during a write operation, and to output read data as the operation source data, to delay the operation source data by a second time required for an operation on the second parity signal and the syndrome information, to output the delayed data as second delayed data, and to output a read parity signal as the first parity signal during a read operation,
  wherein each of the data processing circuit comprises:
    a write data processing circuit configured to output the write data as the operation source data in response to a write enable signal;
    a read data processing circuit configured to output the read data as the operation source data in response to a read enable signal; and
    a delay circuit configured to generate the first delayed data by delaying the operation source data by the first time in response to the write enable signal, and to generate the second delayed data by delaying the operation source data by the second time in response to the read enable signal.

9. The error correction code circuit according to claim 8, wherein the data processing circuit comprises:
  a plurality of data processing units configured to output each of the write data and the read data as the operation source data, to delay the operation source data by the first time and output the delayed data as the first delayed data during the write operation, and to delay the operation source data by the second time and output the delayed data as the second delayed data during the read operation; and
  a parity processing unit configured to output the read parity signal as the first parity signal during the read operation and output the dummy parity signal as the first parity signal during the write operation.

10. The error correction code circuit according to claim 9, wherein the parity processing unit comprises:
  a dummy parity generation circuit configured to generate the dummy parity signal in response to the write enable signal and output the dummy parity signal as the first parity signal; and
  a parity generation circuit configured to output the read parity signal as the first parity signal in response to the read enable signal.

11. A semiconductor apparatus comprising:
  an error correction code circuit configured to generate a second parity signal by performing an error correction code (ECC) operation on operation source data and a first parity signal, and generate syndrome information according to the second parity signal, to use an internally generated dummy parity signal as the first parity signal during a write operation, and to use a read parity signal as the first parity signal during a read operation;

a write path configured to write first delayed data and the second parity signal to a memory area during the write operation; and a read path configured to correct an error in second delayed data according to the syndrome information and output the error-corrected data during the read operation, wherein each of the error correction code circuit comprises:
- a write data processing circuit configured to output the write data as the operation source data in response to a write enable signal;
- a read data processing circuit configured to output the read data as the operation source data in response to a read enable signal; and
- a delay circuit configured to generate the first delayed data by delaying the operation source data by a first time in response to the write enable signal, and to generate the second delayed data by delaying the operation source data by a second time in response to the read enable signal.

12. The semiconductor apparatus according to claim 11, wherein the error correction code circuit is configured to delay the operation source data by the first time required for an operation on the second parity signal and to output the delayed data as the first delayed data during the write operation, and to delay the operation source data by the second time required for an operation on the second parity signal and the syndrome information and to output the delayed data as the second delayed data during the read operation.

13. The semiconductor apparatus according to claim 12, wherein the error correction code circuit comprises:
- a plurality of data processing units configured to output each of the write data and the read data as the operation source data, to delay the operation source data by the first time and output the delayed data as the first delayed data during the write operation, and to delay the operation source data by the second time and output the delayed data as the second delayed data during the read operation; and
- a parity processing unit configured to output the read parity signal as the first parity signal during the read operation and output the dummy parity signal as the first parity signal during the write operation.

14. The semiconductor apparatus according to claim 13, wherein the parity processing unit comprises:
- a dummy parity generation circuit configured to generate the dummy parity signal in response to the write enable signal and output the dummy parity signal as the first parity signal; and
- a parity generation circuit configured to output the read parity signal as the first parity signal in response to the read enable signal.

15. The semiconductor apparatus according to claim 11, wherein the write path comprises:
- a global line configured to transmit write data provided from the outside of the semiconductor apparatus to the error correction code circuit; and
- a write driver configured to drive the first delayed data and the second parity signal and write the driven first delayed data and second parity signal to the memory area.

16. The semiconductor apparatus according to claim 11, wherein the read path comprises:
- a sense and amplification (sense/amplification) circuit configured to sense and amplify read data and the read parity signal output from the memory area;
- a global line configured to transmit output of the sense/amplification circuit to the error correction code circuit; and
- a data correction circuit configured to correct an error included in the second delayed data according to the syndrome information and output the error-corrected data.

* * * * *